(12) United States Patent
Balakrishnan et al.

(10) Patent No.: US 10,965,240 B2
(45) Date of Patent: Mar. 30, 2021

(54) METHOD AND CIRCUIT FOR DETECTING MOTOR WINDING OVER TEMPERATURE

(71) Applicant: TEXAS INSTRUMENTS INCORPORATED, Dallas, TX (US)

(72) Inventors: Manu Balakrishnan, Kollam (IN); Abhishek Vishwa, Mumbai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/553,732

(22) Filed: Aug. 28, 2019

(65) Prior Publication Data
US 2020/0076349 A1 Mar. 5, 2020

(30) Foreign Application Priority Data

Aug. 30, 2018 (IN) .............................. 201841032510

(51) Int. Cl.
*G05B 5/00* (2006.01)
*H02P 29/64* (2016.01)
*G01R 19/02* (2006.01)
*H02P 23/22* (2016.01)

(52) U.S. Cl.
CPC .............. *H02P 29/64* (2016.02); *G01R 19/02* (2013.01); *H02P 23/22* (2016.02)

(58) Field of Classification Search
CPC ................................. H02P 29/64; G05F 1/70
See application file for complete search history.

(56) References Cited

U.S. PATENT DOCUMENTS

| 5,686,839 | A | * | 11/1997 | Takagi | ............... B60L 15/2009 |
| | | | | | 324/503 |
| 5,995,347 | A | * | 11/1999 | Rudd | ................... H02H 7/0822 |
| | | | | | 361/24 |
| 7,746,013 | B2 | | 6/2010 | Fernengel et al. | |
| 8,487,575 | B2 | | 7/2013 | Yeh et al. | |

FOREIGN PATENT DOCUMENTS

| DE | 102011075605 | 3/2012 |
| JP | 2014011861 | 1/2014 |
| WO | 2011040845 | 4/2011 |

OTHER PUBLICATIONS

International Search Report in corresponding PCT Application No. PCT/US2019/048718, dated Nov. 7, 2019 (2 pages).

* cited by examiner

*Primary Examiner* — Karen Masih
(74) *Attorney, Agent, or Firm* — John R. Pessetto; Charles A. Brill; Frank D. Cimino

(57) ABSTRACT

A hardware-based detection system includes, among other things, a signal-generating circuit for generating a signal which is functionally related to current in a motor winding, a reference current, and a duration of time. The system may also include a comparator circuit for comparing the generated signal to a reference signal, and for thereby detecting an over-temperature condition in the motor winding. If desired, a compensating circuit may be used to generate a variable reference signal as a function of ambient temperature. A method of operating a detection system is also disclosed. If desired, the detection system may be completely implemented in hardware using an uncomplicated analog circuit architecture.

33 Claims, 3 Drawing Sheets

METHOD AND CIRCUIT FOR DETECTING MOTOR WINDING OVER TEMPERATURE

This application claims priority to India Patent Application No. 201841032510, filed Aug. 30, 2018. The entire disclosure of India Patent Application No. 201841032510 is hereby fully incorporated herein by reference.

BACKGROUND

Electrical motor drives are used across many applications, including, but not limited to, home appliances, industrial machinery, telecom devices, medical devices, building automation devices, and automotive devices. When designing a motor drive for certain applications, it may be desirable to ensure that the device can be safely and reliably operated. Safety and reliability have different aspects, which include human/operator safety and the safe operation of the device itself. In particular, it may be important, or even necessary, to protect the operator, or the device or the device surroundings, from an over-heated surface or a fire. Thus, it may be desirable to monitor an electrical motor drive so that it does not develop an over-temperature condition within one or more of its windings or the stator or the rotor including the shaft or the motor body.

Indeed, one of the potential hazards associated with electrical motor drives is fire or a hot surface due to overheating of one or more motor windings. For some devices, it is desirable to continuously monitor the temperature of motor windings to ensure that there is no overheating or associated fire, especially in case of an over-load or other abnormal condition or fault. Many safety standards mention the maximum allowed temperature for different classes of motor windings. The designer may wish to make sure that the winding temperature will stay within such limits.

SUMMARY

The present disclosure overcomes the disadvantages of the prior art to a substantial extent. The present disclosure relates to a hardware-based detection system which includes, among other things: a signal-generating circuit for generating a signal which is functionally related to current in a motor winding, a reference current, and a duration of time; and a comparator circuit, coupled to the signal-generating circuit, for comparing the generated signal to a reference signal, and for thereby detecting an over-temperature condition in the motor winding.

The present disclosure also relates to a detection system which includes, among other things: a signal-generating circuit for generating a signal which is functionally related to current in a motor winding, a reference current, and a duration of time; a comparator circuit for comparing the generated signal to a variable reference signal, and for thereby detecting an over-temperature condition in the motor winding; and a compensating circuit for generating the variable reference signal as a function of the reference current and an ambient temperature.

The present disclosure also relates to a method of operating a hardware-based detection system. The method includes: causing a signal-generating circuit to generate a signal which is functionally related to current in a motor winding, a reference current, and a duration of time; and causing a comparator circuit to compare the signal to a reference signal, and thereby detect an over-temperature condition in the motor winding.

DETAILED DESCRIPTION

Figure 1:
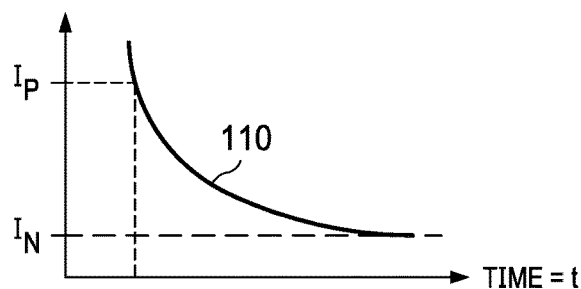
FIG. 1 is a graph of an $I^2t$ curve (or, a thermal limit curve) for a typical multiphase motor.

Referring now to the drawings, where like elements are designated by like reference numerals and other characters throughout, there is shown in FIG. 1 an $I^2t$ curve 110 for a typical motor winding. The instantaneous energy dissipated in a motor winding is proportional to the square of the winding current $I_P$, and the temperature in the winding depends on the time duration t of the energy dissipation. The motor may be designed to continuously operate at a nominal or rated current $I_N$ without exceeding an allowed temperature. Any load current $I_P$ above the nominal current $I_N$ causes excessive loss, which cannot be removed by the motor's cooling device(s). As a result, when the load current $I_P$ is greater than the nominal current $I_N$, the motor temperature increases and eventually exceeds the rated temperature.

When the load current $I_P$ is only slightly greater than the nominal current $I_N$, the time t required for the motor temperature to exceed the rated temperature may be relatively long, but the rated temperature eventually will be exceeded. When the load current $I_P$ is much greater than the nominal current $I_N$, which is the situation illustrated in FIG. 1, the time t required for the motor temperature to exceed the rated temperature may be relatively short. When the load current $I_P$ is less than the nominal current $I_N$, the motor temperature should not exceed the rated temperature regardless of the time duration t.

In general, the energy dissipated by a motor winding under nominal conditions $E_{NOM}$, when the load current $I_P$ is equal to the nominal current $I_N$, is as follows:

$$E_{NOM} = I_{N,RMS}^2 \times R \times t,$$

where $I_{N,RMS}$ is a root-mean-square (RMS) value of the nominal current $I_N$, R is the resistance of the winding(s) carrying the current, and t is the time duration of the energy dissipation.

When the load current $I_P$ is greater than the nominal current $I_N$ (the situation which is shown in FIG. 1), then excess energy $E_P$ is generated by the motor winding as follows:

$$E_P = (I_{P,RMS}^2 - I_{N,RMS}^2) \times R \times t,$$

where $I_{P,RMS}$ is a root-mean-square value of the load current $I_P$.

Since R may be considered constant (neglecting the variation of R with variation in temperature), the latter equation may be simplified as a proportional relationship as follows:

$$E_P \alpha (I_{P,RMS}^2 - I_{N,RMS}^2) \times t.$$

Figure 2:
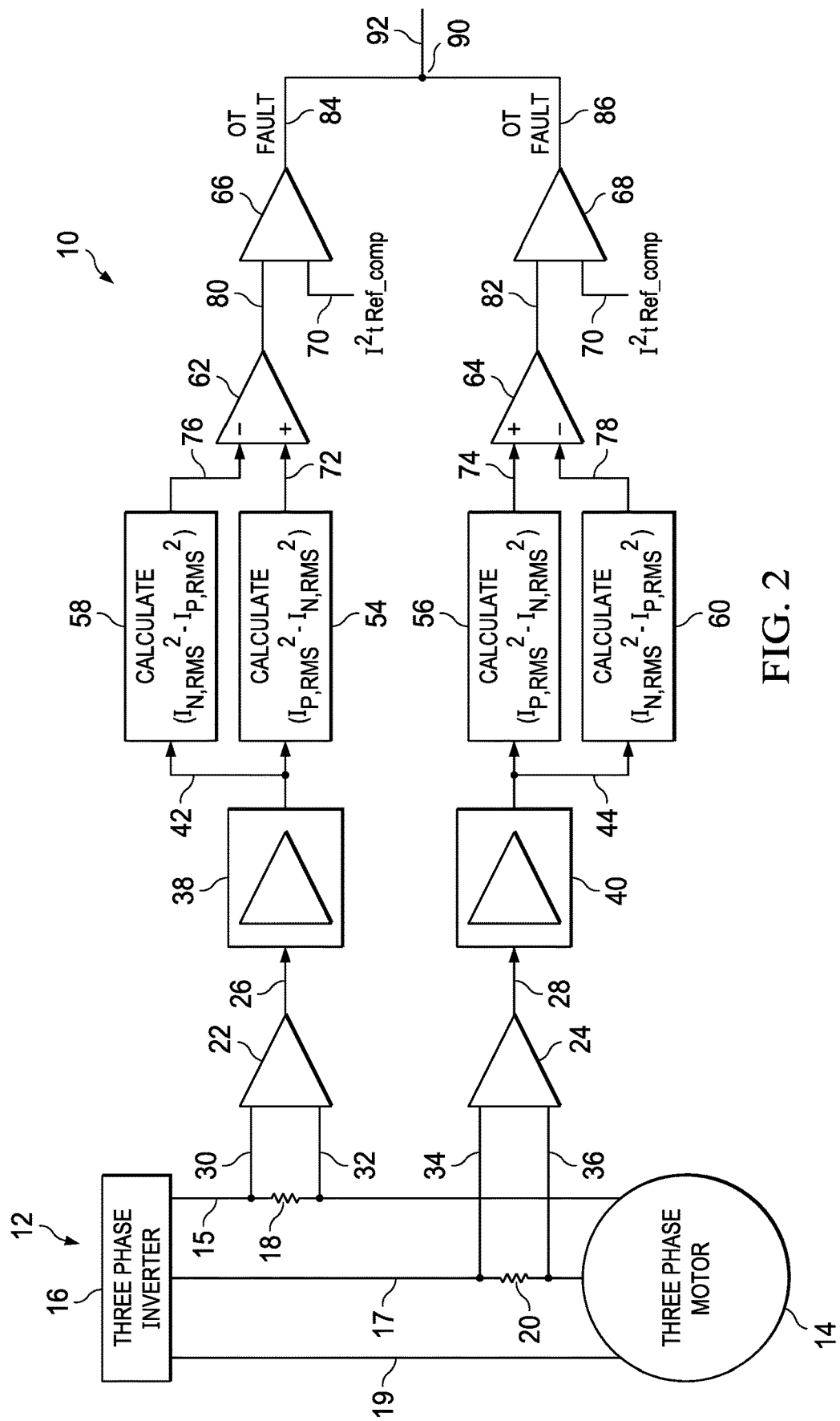
FIG. 2 is a block diagram of a detection system coupled to a drive system, where the detection system is configured to generate a signal representative of a winding overtemperature condition in a multiphase motor.

FIG. 2 is a block diagram which illustrates a hardware-based detection system 10 coupled to a motor drive system 12. The motor drive system 12 may be, for example, configured to operate a household appliance (not illustrated). The detection system 10 is configured to detect an over-temperature (OT) condition in the motor drive system 12. In the illustrated configuration, the motor drive system 12 has a three-phase motor 14 coupled to a three-phase inverter 16, and corresponding multiple motor windings electrically connected to lines 15, 17, 19, and corresponding current sense elements 18, 20 electrically connected in series with the winding connection lines 15, 17. The motor drive system 12 could be a multiphase system where a multiphase motor is driven by a multiphase inverter. The motor drive system 12 illustrated here senses the current through two motor windings out of three windings of the three phase motor 14, using the sense elements 18, 20. An example of a current sense element could be a current sense resistor or a Hall effect sensor or any other suitable sense element but not limited to these.

The illustrated detection system 10 has in-line sensors 22, 24 for sensing (monitoring) respective currents in the windings connected to the lines 15, 17 using the sense elements 18, 20, and for outputting current signals on respective conductive lines 26, 28. The sensors 22, 24 are electrically coupled to opposite ends of the sense elements 18, 20 by suitable electrical connections 30, 32, 34, 36. In the illustrated configuration, the number of in-line sensors 22, 24 (2) is one less than the number of phases of the motor 14 (3). This disclosure should not be limited, however, to the systems and devices shown in the drawings and described in this detailed description. In general, for an N phase motor, no more than N−1 current sensors may be required, especially where the drive system has suitable earth leakage insulation or protection. In general for an N-phase motor, N-current sensors may be required especially where the drive system has no earth leakage insulation or protection or each motor phase winding is independent without an electrical connection between the phase windings.

Further, as illustrated in FIG. 2, the detection system 10 has RMS calculator circuits 38, 40 for receiving the current signals on lines 26, 28, and for outputting corresponding root-mean-square (RMS) signals on conductive lines 42, 44. The RMS calculator circuits 38, 40 calculate the respective RMS values ($I_{P,RMS}$) of the sensed winding currents. The RMS signals correspond to respective load currents $I_{P,RMS}$ sensed within the windings connected to lines 15, 17 by the respective sensor elements 18, 20 and sensors 22, 24.

Following the RMS calculator circuits 38, 40, first multiplier & subtractor circuits 54, 56 are provided for generating first difference signals (the values of which correspond to $I_{P,RMS}^2 - I_{N,RMS}^2$) based on the respective RMS values, and second multiplier & subtractor circuits 58, 60 for generating second difference signals (the values of which correspond to $I_{N,RMS}^2 - I_{P,RMS}^2$) based on the respective RMS values.

In the illustrated example, $I_{N,RMS}$ is the rated nominal motor current for the motor drive system 12. That is, $I_{N,RMS}$ is the motor current at which the temperature will not reach the over temperature (OT) threshold until an infinite time. When the motor drive system 12 draws less than the nominal current $I_{N,RMS}$, the motor drive system 12 will cool to a temperature less than the rated temperature corresponding to the rated current of $I_{N,RMS}$. Hence, a cooling curve is generated by calculating the second difference values ($I_{N,RMS}^2 - I_{P,RMS}^2$) and the same are subtracted from the first difference values ($I_{P,RMS}^2 - I_{N,RMS}^2$) on a time-integrated basis, in suitable integrator circuits 62, 64. As discussed in more detail below, the multiplier & subtractor circuits 54, 56, 58, 60 may include suitable operational amplifiers.

In the illustrated configuration, the integrator circuits 62, 64 receive the difference signals and generate time-integrated signals. Comparator circuits 66, 68 are provided for comparing the integrated signals to a reference signal on line 70. The reference signal on line 70 may correspond to a predetermined fixed $I^2t$ Reference value, or, as discussed in more detail below, the reference signal on line 70 may correspond to a variable $I^2t$ Ref_comp value which changes as a function of ambient temperature. Thus, the detection system 10 has a first signal-generating circuit 22, 38, 54, 58, 62 for generating a first signal on line 80. The first signal (on line 80) is functionally related to current in a first motor winding ($I_{P,RMS}$, associated with line 15), a reference current ($I_{N,RMS}$), and a duration of time (t). The detection system 10 also has a first comparator circuit 66, coupled to the first signal-generating circuit 22, 38, 54, 58, 62, for comparing the first signal to a reference signal $I^2t$ Ref_comp, and for thereby detecting an over-temperature condition in the first motor winding. Moreover, the detection system 10 has a second signal-generating circuit 24, 40, 56, 60, 64 for generating a second signal on line 82. The second signal (on line 82) is functionally related to current in a second motor winding ($I_{P,RMS}$, associated with line 17), a reference current ($I_{N,RMS}$), and a duration of time (t). The detection system 10 also has a second comparator circuit 68, coupled to the second signal-generating circuit 24, 40, 56, 60, 64, for comparing the second signal to the reference signal $I^2t$ Ref_comp, and for thereby detecting an over-temperature condition in the second motor winding.

As illustrated in FIG. 2, by way of example, the difference signals may be output from the multiplier & subtractor circuits 54, 56, 58, 60 and input to the respective integrator circuits 62, 64 on conductive lines 72, 74, 76, 78, and the time-integrated signals may be output from the respective integrator circuits 62, 64 and input to the respective comparator circuits 66, 68 on other conductive lines 80, 82.

In operation, one of the comparator circuits 66, 68 (or both) issues (or issue) an OT Fault signal on a respective conductive line 84, 86 whenever the value of a respective integrated signal exceeds the value of the $I^2t$ Reference signal (or the variable $I^2t$ Ref_comp value). Outputs from the comparator circuits 66, 68 are merged at node 90, such that an OT condition warning signal is generated on a conductive line 92 whenever at least one of the comparator circuits 66, 68 issues an OT Fault signal. If desired, the conductive line 92 is operatively connected to a suitable operator interface (not illustrated) to warn an operator that there is an OT condition. Alternatively, the conductive line 92 may be operatively connected to a suitable electrical or mechanical controller (not illustrated) for automatically taking a corrective action, for example, by disconnecting the motor drive system 12 from a power source (not illustrated).

Figure 3:
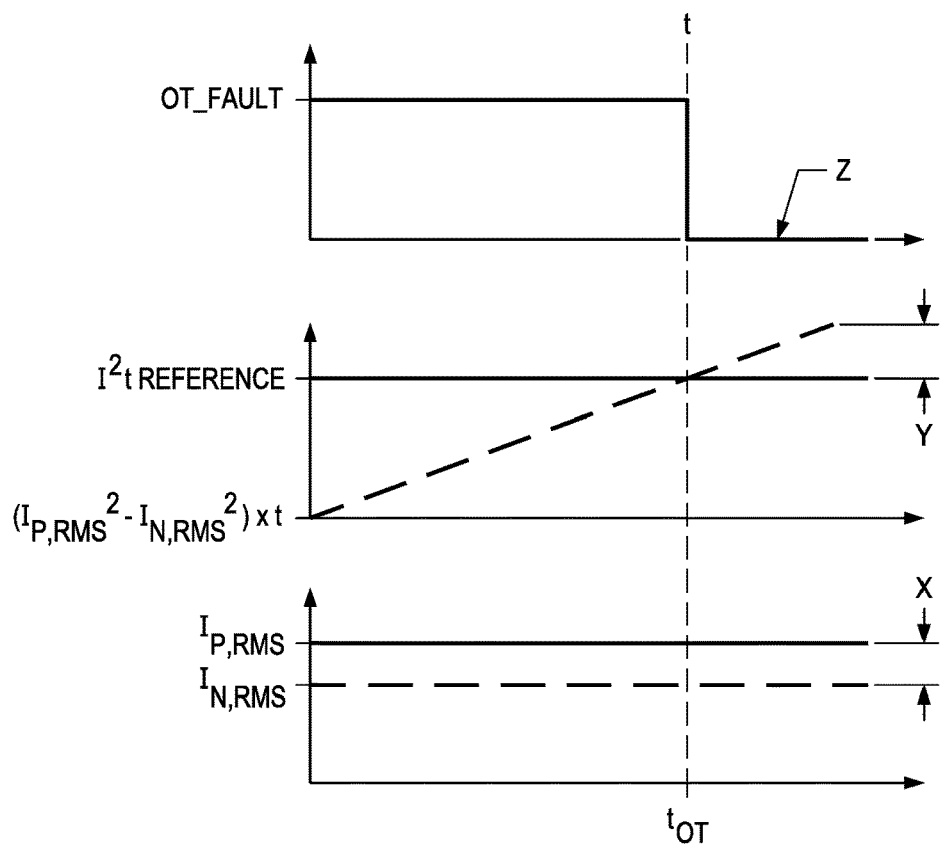
FIG. 3 is a waveform diagram for the detection system of FIG. 2.

As illustrated in FIG. 3, when the load current $I_{P,RMS}$ of one of the windings is continuously greater than the nominal current $I_{N,RMS}$ by an amount x, the integrated value $[(I_{P,RMS}^2 - I_{N,RMS}^2) \times t]$ represented by the output signal from the respective integrator circuit 62, 64 increases over time. As discussed in more detail below, when a motor winding connected to lines 15, 17 has operated at the load current $I_{P,RMS}$ for a period of time greater than $t_{OT}$, the output signal generated by the respective integrator circuit 62, 64 exceeds the $I^2t$ Reference signal by an amount y, which causes an OT condition warning signal to be generated on the merged conductive line 92.

When the actual motor current is more than the nominal current, the respective motor winding(s) will heat. When the load current $I_{P,RMS}$ is greater than the nominal current $I_{N,RMS}$, but only by a relatively small amount, then the amount of time $t_{OT}$ it takes for the detection system 10 to generate the OT condition warning signal is relatively long. When the load current $I_{P,RMS}$ is greater than the nominal current $I_{N,RMS}$, and by a relatively large amount, then the amount of time $t_{OT}$ it takes for the detection system 10 to generate the OT condition warning signal is correspondingly short. When the load current $I_{P,RMS}$ is always less than the nominal current $I_{N,RMS}$, in all of the windings connected to lines 15, 17 (a condition which is not shown in FIG. 3), then the illustrated detection system 10 does not generate the OT condition warning signal.

According to one aspect of this disclosure, an appropriate value for the nominal current $I_{N,RMS}$ may be obtained from information provided on the manufacturer's name plate (not illustrated), which may be attached to the motor drive system 12. If the name plate indicates, for example, that the motor drive system 12 is configured to carry a 2-A winding current (specified up to 25° C. ambient), wherein the motor winding will heat to the rated temperature (for example 100° C.) at infinite time (steady state temperature) then $I_{N,RMS}$=2 A. This would mean that the motor windings connected to lines 15, 17 can each carry 2A continuously at an ambient temperature of 25° C. However, the present disclosure should not be limited to the configurations and numerical values described herein, which are meant to characterize non-limiting examples of the present disclosure.

Figure 4:
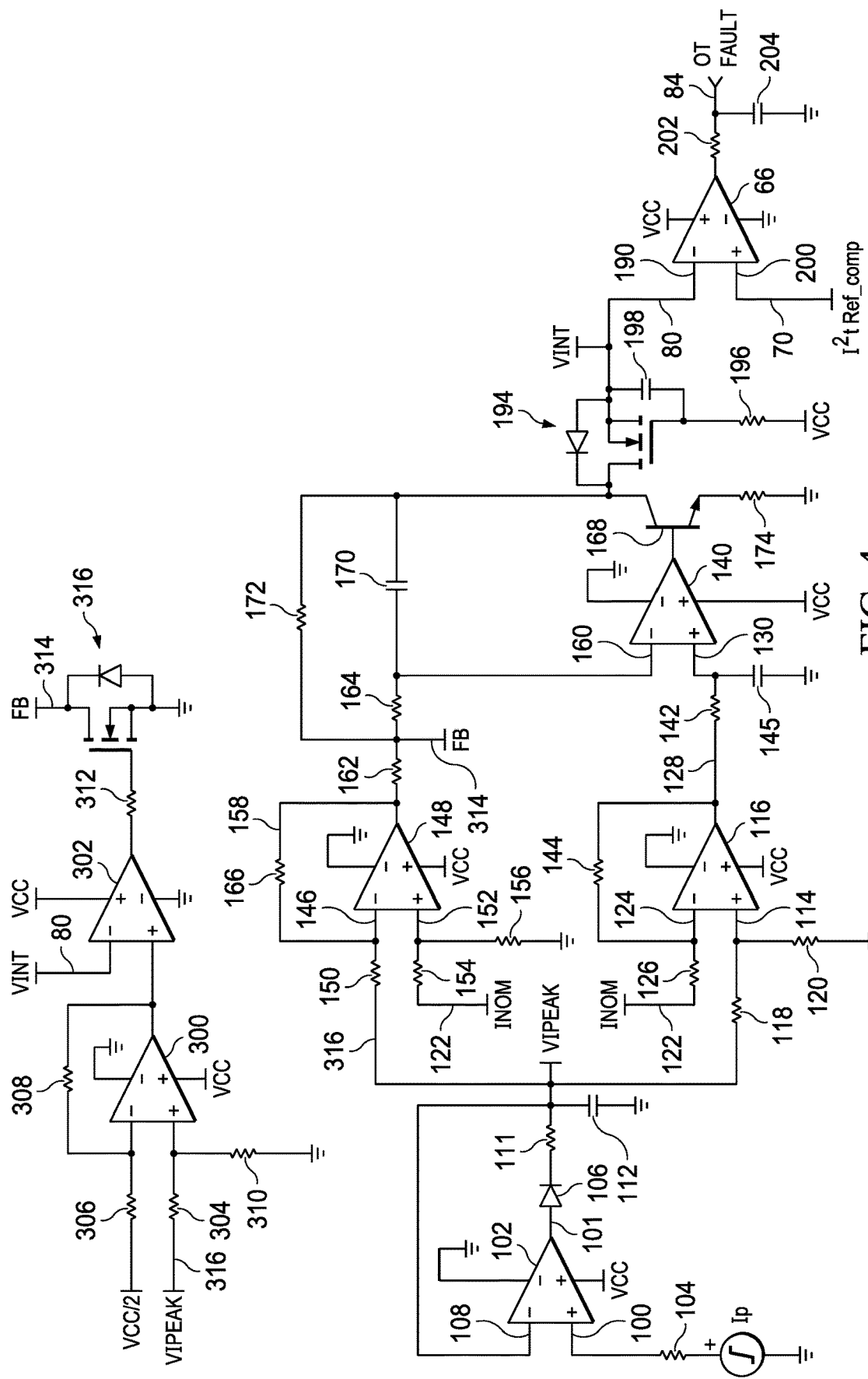
FIG. 4 is a circuit diagram for a portion of the detection system of FIG. 2.

FIG. 4 illustrates a circuit level implementation of a portion of the detection system 10, where the voltage equivalent to the current sensed in the first winding, connected to line 15, is available at $I_P$, and is supplied to a non-inverting input 100 of a first operational amplifier 102, through a suitable resistor 104. The signal $I_P$ is an equivalent signal at the output of the first inline sensor 22 at the signal output line 26 of FIG. 2. The motor windings typically carry alternating (bipolar) current. While sensing alternating current, the output of the sensor 22 is normally bipolar (having both positive and negative polarity). To make the sensor circuit and further circuits simpler, typically a unipolar output is used wherein the operational amplifiers can be operated with unipolar power supply VCC referred signal ground. To achieve this, the outputs of the sensors 22, 24 are level shifted by a voltage VCC/2 (not illustrated here), and the level shifted signals are available at lines 26, 28 of FIG. 2. The signal $I_P$ (FIG. 4) is the level shifted (by VCC/2) voltage signal available at line 26 (or line 28) of FIG. 2, equivalent to the current flowing in the motor windings connected to lines 15, 17 of FIG. 2. When the winding current is zero, the corresponding $I_P$ signal voltage is VCC/2, when the winding current is positive (current flows into the motor winding), the corresponding $I_P$ signal voltage is more than VCC/2, and when the winding current is negative (current flows out of the motor winding), the corresponding $I_P$ signal voltage is less than VCC/2. The operational amplifier 102 is an element of the first RMS calculator 38 (FIG. 2). The output of the first operational amplifier 102 is available on conductive line 101 (FIG. 4) transmitted through a suitable diode 106, supplied to the inverting input 108 of the operational amplifier 102 through a suitable resistor 111, coupled to ground by the resistor 111 and a suitable capacitor 112, supplied to the non-inverting input 114 of a second operational amplifier 116 through resistor 111 and another suitable resistor 118, and coupled to ground by resistors 111, 118 and another suitable resistor 120.

Thus, the circuit illustrated in FIG. 4 includes a peak detector which includes, but is not limited to, the first operational amplifier 102, the diode 106, and the associated resistor 111 and capacitor 112. In operation, the peak detector tracks the peak of the output of the first current sensor 22 (FIG. 2). Meanwhile the second operational amplifier 116 calculates motor winding heating by approximately calculating the first difference value $(I_{P,RMS}^2 - I_{N,RMS}^2)$. The approximation may be accomplished using, for example, an opamp gain of 1.2V/V over a suitable range (which may be from $I_P$ to $I_N$). However, as noted above, the present disclosure should not be limited to the configurations and numerical values described herein. The output of the heating amplifier circuit, on conductive line 128, is connected to the non-inverting input 130 of an integrator/third operational amplifier 140.

INOM, the level shifted (by VCC/2) voltage equivalent to the nominal current $I_{N,RMS}$, is applied, on a conductive line 122, to the inverting input 124 of the second operational amplifier 116, through a suitable resistor 126. The output of the second operational amplifier 116, on conductive line 128, is applied to the non-inverting input 130 of the third operational amplifier 140 through a suitable resistor 142, and to the inverting input 124 of the second operational amplifier 116 through another suitable resistor 144. In operation, the first RMS calculator circuit 38 (FIG. 2) and the difference value $(I_{P,RMS}^2 - I_{N,RMS}^2)$ calculator 54 of FIG. 2 include the first operational amplifier 102 (FIG. 4) (operating as a peak detector) and the second operational amplifier 116 (operating as a gain stage). The non-inverting input 130 of the third operational amplifier 140 is electrically coupled to ground through a suitable capacitor 145.

The current signal that is transmitted through the diode 106 is also supplied to the inverting input 146 of a fourth operational amplifier 148 through resistor 111 and another suitable resistor 150. INOM, the level shifted (by VCC/2) voltage equivalent to the nominal current $I_{N,RMS}$, is applied, on conductive line 122, to the non-inverting input 152 of the fourth operational amplifier 148, through a suitable resistor 154, and is electrically coupled to ground through resistor 154 and another suitable resistor 156. The output of the fourth operational amplifier 148, on conductive line 158, is applied to the inverting input 160 of the third operational amplifier 140 through suitable resistors 162, 164, and to the inverting input 146 of the fourth operational amplifier 148 through a suitable resistor 166.

In operation, when motor current is less than the nominal current, the respective motor winding will cool to a temperature less than the rated temperature corresponding to the rated current of $I_{N,RMS}$. The fourth operational amplifier 148 calculates the cooling by approximately calculating the second difference value $(I_{N,RMS}^2 - I_{P,RMS}^2)$. The approximation may be achieved by using, for example, an opamp gain of 0.48V/V over a suitable range (which may be from $I_N$ to $I_P$). The output, on line 158, of the cooling amplifier circuit is connected to the inverting input 160 of integrator/third operational amplifier 140.

If desired, the time constant of the integrator RC circuit may be tuned based on the value of the nominal $I^2t$ value. For that purpose, capacitor 145 and resistor 142, and capacitor 170 and resistor 164 form the RC time constants. The capacitance C of capacitors 145, 170 may be equal to each other, and the resistance R of resistors 142, 164 may be equal to each other, in which case the integrator gain equals 1/RC. Meanwhile, resistor 172 receives an FB signal on line 314 to imitate the motor pre-heating when the motor current is less than the rated current $I_{N,RMS}$ for a long time before the abnormal operation happens, wherein the abnormal motor current is more than the nominal current $I_{N,RMS}$.

The output of the third operational amplifier 140 is coupled to the base of an NPN bipolar junction transistor (BJT) 168. The collector of the BJT transistor 168 is coupled to the inverting input 160 of the third operational amplifier 140 through capacitor 170. The capacitor 170 is connected in parallel to a resistor network 172, 164. The emitter of the transistor 168 is electrically coupled to ground through a suitable resistor 174.

The collector of the BJT transistor 168 is also coupled to the inverting input 190 of a fifth operational amplifier (that is, the first comparator) 66 through a suitable MOSFET 194 and conductive line 80. The MOSFET 194 is coupled to a power supply VCC by a suitable resistor 196 and a suitable capacitor 198. The non-inverting input 200 of the fifth operational amplifier/first comparator 66 receives the variable reference signal $I^2t$ Ref_comp (or a fixed reference signal $I^2t$ Reference) on conductive line 70. When the signal applied to the inverting input 190 is greater than the reference signal, the comparator circuit 66 generates the OT Fault signal on line 84. The OT Fault signal is transmitted through a suitable resistor 202 and conductive line 84, which is coupled to ground through a suitable capacitor 204. The BJT 168 (at the output of the third operational amplifier 140) and the MOSFET 194 (associated with the fifth operational amplifier 66) may be used, if desired, to ensure that the integrator capacitor 170 does not discharge in the event of a power supply failure, but maintains charge in the detection system 10, to thereby ensure a capacitive holding-charge effect that is similar to the motor holding-heat until it dissipates. The values of the RC circuit made up of elements 170, 172, 164 are selected such that the RC time constant of this circuit is equivalent to the cooling time constant of the motor.

In operation, the gain of the second and third operational amplifiers 116, 140 is adjusted together to obtain a linear approximation of a squaring circuit in the vicinity of the winding current $I_P$. Thus, the first, second, and third operational amplifiers 102, 116, 140 operate in combination to implement the desired RMS and squaring functions, for the first difference signals. The second operational amplifier 116 is an element of a first difference calculating circuit 54 (FIG. 2), and the fourth operational amplifier 148 (FIG. 4) is an element of the corresponding second difference calculating circuit 58.

The foregoing description has assumed that the motor drive system 12 starts with current=$I_P$, and the initial temperature when the motor drive system starts is equal to the ambient temperature. However, if the motor drive system 12 was running at slightly less than rated current for a long time and then suddenly an abnormal condition happens to increase the motor current more than the nominal current, the initial temperature from which overheating starts is not ambient temperature, but close to the OT threshold and hence the time to reach the OT threshold is less. On the other hand, if the motor drive system 12 was running a current very much lower than the rated current for a long time, then the initial temperature is close to ambient temperature and the time required to reach the OT threshold is more.

To address the above-mentioned circumstances, the circuit illustrated in FIG. 4 may also have sixth and seventh operational amplifiers 300, 302 coupled to suitable resistors 304, 306, 308, 310, 312 for setting an initial condition in the integrator circuit 140 when the load current $I_P$ is less than the nominal current $I_N$. In particular, signal FB on line 314 (electrically connected to resistors 172, 162, 164) is generated to set an initial condition in the integrator circuit 140 when the load current $I_P$ is lower than the nominal current $I_N$.

In operation, a VIPEAK signal is applied, on line 316, through resistor 304, to the non-inverting input of the sixth operational amplifier 300. The non-inverting input of the sixth operational amplifier 300 is coupled to ground through resistor 310. Meanwhile, a VCC/2 signal is applied through resistor 306 to the inverting input of the sixth operational amplifier 300, which has feedback resistor 308.

The output of the sixth operational amplifier 300 is applied to the non-inverting input of the seventh operational amplifier 302, and a VINT signal is applied, on line 80, to the inverting input of the seventh operational amplifier 302. The VINT signal is the same as the signal applied to the inverting input of the operational amplifier 66. The output of the seventh operational amplifier 302 is applied to resistor 312 and a MOSFET 316 to generate the FB signal on conductive line 314. The operational amplifier 300 is a difference amplifier where VIPEAK minus VCC/2 signal is generated. The VCC/2 voltage signal corresponds to zero current and hence the output of the operational amplifier 300 can be considered as a voltage equivalent to the peak value of winding current $I_P$ or $I_{P,RMS}$ with a suitable gain. The operational amplifier 302 is configured as a comparator. When the noninverting input of the operational amplifier 302 is greater than VINT signal at the inverting input of the operational amplifier 302, the output of the operational amplifier 302 becomes high (equal to VCC) and the MOSFET switch 316 turns on, to make the FB voltage approximately equal to zero volts. When $I_{P,RMS}$ is less than $I_{N,RMS}$, the output of the second amplifier 116 at line 128 is zero volts, and the VINT signal at line 80 remains constant when the FB signal is pulled to ground by turning on the MOSFET 316.

If desired, at least the second, third, fourth, and fifth operational amplifiers 116, 140, 148, 66 may be formed on or within a single chip. If desired, at least the second, third, fourth, fifth, sixth, and seventh operational amplifiers 116, 140, 148, 66, 300, 302 may be formed on or within a single chip.

The system illustrated in FIG. 4 has multiple stages for implementing an RMS calculator, squaring circuits, integrator, and comparator, and for responding to an OT condition in the first winding connected to line 15 (FIG. 2) by generating an OT Fault signal on line 84. Another circuit (not shown, but essentially the same as the system illustrated in FIG. 4) may be coupled to the second winding connected to line 17 (FIG. 2) and the output node 90, for responding to an OT condition in the second winding connected to line 17 by generating an OT Fault signal on line 86.

Figure 5:
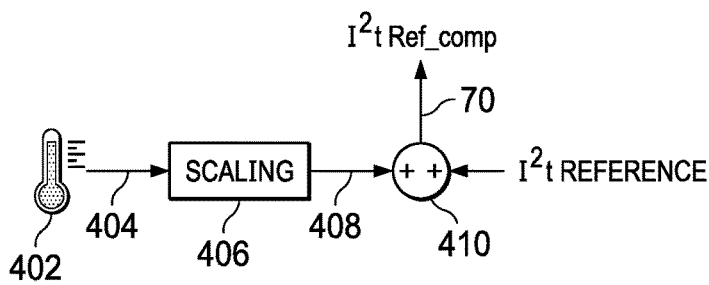
FIG. 5 is a block diagram of a system for compensating for ambient conditions, which may be used in connection with the detection system of FIGS. 2 and 4.

FIG. 5 is a block diagram of a compensating circuit 69 for generating variable (compensated) reference signal $I^2t$ Ref_comp on conductive line 70. The value of the compensated reference signal changes as a function of the ambient temperature, whereas the value of a fixed $I^2t$ Reference signal may be a constant for the motor drive system 12 in a given working environment. The compensating circuit 69 illustrated in FIG. 5 generates the variable reference signal as a function of ambient temperature As illustrated in FIG. 5, one or more analog temperature sensors 402 may be provided for generating a temperature signal on line 404 representative of the ambient temperature, and a scaling circuit 406 for generating a scaling signal on line 408 corresponding to the temperature signal. A compensating circuit 410 applies the scaling signal to the fixed $I^2t$ Reference signal, to thereby generate the compensated reference signal on line 70. In the illustrated configuration, the compensating circuit 410 adds or subtracts the scaling signal to or from the I²t Reference signal.

In general, when the ambient temperature sensed by the one or more ambient temperature sensors 402 increases, the value of the compensated reference signal on line 70 decreases, and vice versa. As a result, when the ambient temperature increases, the load current-based signal on line 80 (FIG. 2) which causes the OT warning condition to be generated decreases, and vice versa. The term "ambient temperature" means temperature in the vicinity of the motor drive system 12, at a location which is not affected by heat generated by the motor windings electrically connected to lines 15, 17. The placement of the sensor(s) 402 may be performed, if desired, without any complex assembly requirements. A relatively uncomplicated, low-cost sensor can be used for such purpose.

The devices and methods described herein, which involve a hardware implementation for detecting a motor-winding over-temperature condition, have many advantages. The circuit architecture may be based on well understood and readily available amplifiers and comparators, and therefore may be easy to implement. They involve indirect determination of winding over-temperature, and therefore do not require temperature sensors configured for direct measurement of the temperature of the windings.

The detection system 10 may have an uncomplicated analog chip architecture, and does not require a separate printed circuit board (PCB). The system 10 may advantageously be implemented on the same PCB on which the motor drive system 12 is supported without any complex assembly requirements, and may consume less space because the sensors 22, 24 may be constructed in an in-line configuration. As a result of these features, the illustrated systems may be produced at reduced cost compared to known systems and still have the desired accuracy. Also, since the solution architecture may employ relatively common operational amplifiers, improved integration may be possible.

Another advantage of the systems 10 described herein is that they may not be adversely affected by ageing. In contrast, known devices with direct temperature sensors are prone to ageing problems like dislocation of sensors, and are subject to improper or impractical maintenance.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A hardware-based detection system, comprising:
   a first signal-generating circuit for generating a first signal which is functionally related to a current in a first motor winding, a nominal current, and a duration of time; and
   a first comparator circuit, coupled to the first signal-generating circuit, for comparing the first signal to a reference signal and producing an over temperature signal.

2. The detection system of claim 1, in which the first signal-generating circuit includes an integrator circuit, and the first signal is functionally related to a square of the motor winding current minus a square of the nominal current integrated over the duration of time.

3. The detection system of claim 2, including a first sensor for generating a current signal representative of the current in the first motor winding.

4. The detection system of claim 3, including an RMS calculator circuit, coupled to the sensor, for generating an RMS signal based on the current signal.

5. The detection system of claim 4, including operational amplifiers, coupled to the RMS calculator circuit and the first comparator circuit, for generating the first signal.

6. The detection system of claim 1, including:
   a second signal-generating circuit for generating a second signal which is functionally related to a second current in a second motor winding, the nominal current, and the duration of time; and
   a second comparator circuit, coupled to the second signal-generating circuit, for comparing the second signal to the reference signal and producing an over temperature signal.

7. The detection system of claim 6, in which the second signal-generating circuit includes an integrator circuit, and the second signal is functionally related to a square of the second motor winding current minus a square of the reference current integrated over the duration of time.

8. The detection system of claim 7, including a circuit, including operational amplifiers, for taking into account cooling, and for setting an initial condition in the detection system when the current in the first motor winding is less than the nominal current.

9. The detection system of claim 1, in which the reference signal includes a variable reference signal, and the detection system includes a compensating circuit for generating the variable reference signal as a function of ambient temperature.

10. The detection system of claim 9, in which the first signal-generating circuit includes an integrator circuit, and the first signal is functionally related to a square of the motor winding current minus a square of the nominal current integrated over the duration of time.

11. The detection system of claim 10, including a sensor for generating a current signal representative of the current in the first motor winding.

12. A system comprising:
    a first sensor for sensing a first current in a first motor winding; and
    a hardware-based detection system, including:
       a first signal-generating circuit for generating a signal which is functionally related to the first current sensed by the first sensor, a nominal current, and a duration of time; and
       a first comparator circuit, coupled to the signal-generating circuit, for comparing the signal to a reference signal and producing an over temperature signal.

13. The system of claim 12, in which the sensor is an in-line current sensor for sensing the first current in the first motor winding.

14. The system of claim 12, including operational amplifiers, coupled to the comparator circuit, for generating the signal which is functionally related to the first current in the first motor winding, the nominal current, and the duration of time.

15. The system of claim 12, including:
    a second sensor for sensing a second current in a second motor winding;
    a second signal-generating circuit for generating a second signal which is functionally related to the second current sensed by the second sensor, the nominal current, and the duration of time; and a second comparator circuit, coupled to the second signal-generating circuit, for comparing the second signal to the reference signal, and producing an over temperature signal.

16. The system of claim 15, in which the first signal-generating circuit includes one or more circuits for generating a difference signal for taking into account cooling, and for setting an initial condition in the system when the first current in the first motor winding is less than the nominal current.

17. A method of operating a hardware-based detection system, comprising:
    causing a signal-generating circuit to generate a signal which is functionally related to current in a motor winding, a nominal current, and a duration of time; and
    causing a comparator circuit, coupled to the signal-generating circuit, to compare the signal to a reference signal, and detect an over-temperature condition in the motor winding.

18. The method of claim 17, including sensing the current in the motor winding.

19. The method of claim 17, including causing a compensating circuit to cause the reference signal to vary as a function of ambient temperature.

20. The method of claim 19, including using transistors to maintain charge in the detection system during a loss of power supply.

21. A temperature detection circuit comprising:
    (a) a first current sensor having inputs adapted to be coupled to a first winding of a motor and having a first sensor output;
    (b) a first calculator circuit having an input coupled to the first sensor output and having a first calculator output;
    (c) a first difference circuit having an input coupled to the first calculator output, having a nominal current input, and having a first difference output;
    (d) a second difference circuit having an input coupled to the first calculator output, having a nominal current input, and having a second difference output;
    (e) an integrator circuit having a first input coupled to the first difference output, having a second input coupled to the second difference output, and having an integrated output; and
    (f) a first comparator circuit having an input coupled to the integrated output, having a reference signal input, and having an over temperature output.

22. The circuit of claim 21 in which the first calculator circuit includes a peak detector operational amplifier having a non-inverting input coupled to the first sensor output, having a peak voltage output, and having an inverting input coupled to the peak voltage output.

23. The circuit of claim 22 in which the first difference circuit includes a second operational amplifier having a non-inverting input coupled to the peak voltage output, having an inverting input coupled to a shifted nominal current input, and having a heating difference output.

24. The circuit of claim 23 in which the second difference circuit includes a third operational amplifier having an inverting input coupled to the peak voltage output, having a non-inverting input coupled to the shifted nominal current input, and having a cooling difference output.

25. The circuit of claim 24 in which the integrator circuit includes a fourth operational amplifier having a non-inverting input coupled to the heating difference output, having an inverting input coupled to the cooling difference output, having an integrated output, and having a resistor and capacitor network coupled between the integrated output and the inverting input.

26. The circuit of claim 25 in which the comparator circuit has an inverting input coupled to the integrated output, has a non-inverting input coupled to a reference input, and having the over temperature output.

27. The circuit of claim 26 including an initial condition circuit, the initial condition circuit including:
    a fifth operational amplifier having an inverting input coupled to a VCC/2 input, having a non-inverting input coupled to the peak voltage output, and having an output; and
    a sixth operational amplifier having an inverting input coupled to the inverting input of the comparator circuit, having a non-inverting input coupled to the output of the fifth operational amplifier, and having a feedback output coupled to the resistor and capacitor network.

28. The circuit of claim 21 including a multiphase inverter circuit having a first conductor adapted to be coupled to the first motor winding and the sensor inputs being coupled to the first conductor.

29. The circuit of claim 28 in which the first conductor includes a resistor and the sensor inputs are coupled to the resistor.

30. A process of determining a temperature of a motor winding comprising:
    (a) sensing a load current through a first winding of the motor and providing a load voltage equivalent to the load current;
    (b) calculating an RMS load voltage from the load voltage;
    (c) calculating a first difference value by subtracting the RMS load voltage from an RMS nominal voltage;
    (d) calculating a second difference value by subtracting the RMS nominal voltage from the RMS load voltage;
    (e) integrating the first difference value and the second difference value over time to produce an integrated output;
    (f) comparing the integrated output to a reference voltage to produce an over temperature signal.

31. The process of claim 30 including using operational amplifiers to perform the sensing, the calculating an RMS load voltage, calculating a first difference value, calculating a second difference value, integrating, and comparing.

32. The process of claim 30 in which the integrating includes integrating with an operational amplifier and a resistor and capacitor network.

33. The process of claim 30 including imitating preheating of the motor when the load current is less than a nominal current with a feedback voltage, and the integrating includes integrating with an operational amplifier and a resistor and capacitor network coupled to the feedback voltage.

* * * * *